Dec. 21, 1965 W. D. REXROAD 3,225,313
PULSE TRIGGERED VHF CRYSTAL CONTROLLED OSCILLATOR
Filed April 12, 1963
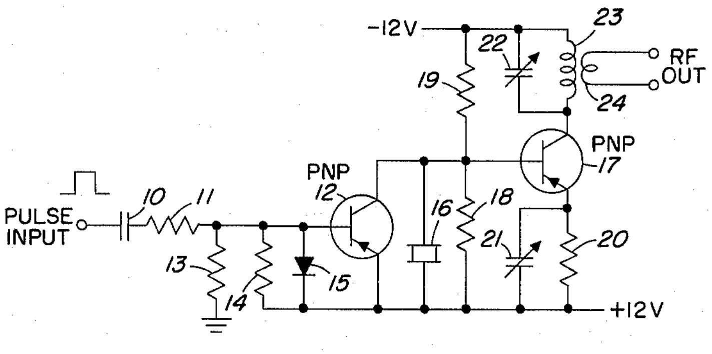
INVENTOR.
WILLIAM D. REXROAD
BY *Moody and Kintzinger*
ATTORNEYS

3,225,313
PULSE TRIGGERED VHF CRYSTAL CONTROLLED OSCILLATOR

William D. Rexroad, Cedar Rapids, Iowa, assignor to Collins Radio Company, Cedar Rapids, Iowa, a corporation of Iowa Filed Apr. 12, 1963, Ser. No. 272,582
1 Claim. (Cl. 331—173)

This invention relates in general to pulse trigger actuated and controlled RF signal generators, and in particular to a pulse controlled RF crystal oscillator useful for generating RF pulses up in the VHF range.

A commonly used method for generating RF pulses, regardless of the radio frequency involved, is to supply a CW signal for turning an electronic gate on and off for controlling the RF pulse output from a continuously operating frequency generator. With continuous operation of the frequency generator in such a system even though the output is gated off, a relatively high CW level is likely to be passed through distributed capacitive constants and is likely to be more troublesome with higher RF frequencies. This has been such a problem with some RF signal generators that operate continually as to require expensive, complex and at times troublesome circuitry to reduce and mask such CW between pulses in a pulse gated signal system. This problem may be overcome with absolutely no CW signal level to be concerned about with a system with complete RF generator turnoff between signal pulses, and should be accomplished with simple and reliable circuitry so isolated from the RF generating circuitry so as to not alter or disturb the frequency stability of the oscillator itself.

It is, therefore, a principal object of this invention to provide RF pulses from an RF crystal oscillator actuated for RF signal output pulses by D.C. pulse signals and having complete crystal oscillator turnoff between pulses. This effectively eliminates reduced level CW signal problems between RF pulses present with many gate pulse controlled RF signal system.

A further object is to provide a pulse controlled RF pulse signal system having high RF stability with a simple reliable circuit and without alteration, or deterioration, of frequency stability of the oscillator itself.

A feature of this invention, useful in accomplishing the above objects is the use of a VHF crystal oscillator with the crystal in parallel with a transistor normally biased to the conductive state and providing a short circuit across the crystal for turnoff of the crystal oscillator. Signal input D.C. pulses applied through a coupling capacitor and a resitor to the base of the crystal shorting transistor reverse bias the transistor for the duration of each pulse applied, simultaneously eliminating the short across the crystal oscillator to immediately resume vibration for providing an RF output signal pulse during the duration of each input D.C. pulse. An input resistor and a diode, connected between the base and the emitter of the transistor, limit amplitude of pulse signal voltage applied at the base of the oscillator crystal shorting and signal trigger controlling transistor.

A specific embodiment representing what is presently regarded as the best mode of carrying out the invention is illustrated in the accompanying drawing.

Referring to the drawing:

Signal input D.C. pulses are applied serially through capacitor 10 and resistor 11 to the base of PNP transistor 12. The junction of the resistor 11 and the base of transistor 12 is connected through resistor 13 to ground, and through resistor 14 and diode 15 in parallel to a positive voltage supply. The diode is connected with anode to the junction between the resistor 11 and the base of transistor 12, and with cathode to the positive voltage supply. Transistor 12 is connected in parallel with an oscillator crystal 16 between the positive voltage supply and the base of a second PNP transistor 17 with the emitter of transistor 12 connected to the positive voltage supply and the collector to the base of transistor 17. The positive voltage supply is also connected to the base of transistor 17 through resistor 18, and a minus voltage supply is also connected to the base of transistor 17 through resistor 19. A resistor 20 and an adjustable capacitor 21 are connected in parallel between the positive voltage supply and the emitter of PNP transistor 17 and act with circuit stray inductance as an RF tuned subcircuit, and an adjustable capacitor 22 and the primary coil 23 of a transformer coupling are connected in parallel as an RF tuned subcircuit between the minus voltage supply and the collector of PNP transistor 17. The secondary coil 24 of the transformer coupling is provided with RF signal output terminals to which connections may be made for utilization as desired.

In operation, a positive D.C. voltage pulse, applied through capacitor 10 and resistor 11, reverse biases PNP transistor 12, cutting off conduction through the transistor. This acts as a switch permiting immediate reestablishment of operating bias developed from the positive voltage supply through resistors 18 and 19 to the minus voltage supply, and across crystal 16. The crystal 16 along with the PNP transistor 17 and the associated tuned circuitry operates as an RF crystal oscillator circuit for developing an RF output signal in secondary coil 24. Throughout the duration of each D.C. input pulse, resistor 11 and diode 15 limit the amplitude of the input pulse voltage applied at the base of transistor 12. Furthermore, the time constant of the capacitor 10 and its associated circuitry, resistors 11 and 13, and resistor 14 and diode 15 connected in parallel to the positive voltage supply is sufficient to maintain transistor 12 in the cutoff nonconductive state through the duration of any D.C. input pulse expected during normal operation.

Components and values used in a pulse modulated VHF crystal oscillator, according to the invention, providing satisfactory operation with D.C. input control pulses as narrow as 2.0 $\mu$s., include the following:

| | |
|---|---|
| Capacitor **10** | 1000 pf. |
| Resistor **11** | 6.8K ohms. |
| PNP transistor **12** | 2N1224. |
| Resistor **13** | 27K ohms. |
| Resistor **14** | 1.8K ohms. |
| Diode **15** | 1N67. |
| Piezo-electric crystal **16** | 103 mc. |
| PNP transistor **17** | 2N1143. |
| Resistor **18** | 1.8K ohms. |
| Resistor **19** | 10K ohms. |
| Resistor **20** | 1K ohms. |
| Adjustable capacitor **21** | 1.5–7 pf. |
| Adjustable capacitor **22** | 1.5–7 pf. |
| Primary coil **23** | 0.3 $\mu$h. |
| Secondary coil **24** | Approximately ½ turn. |
| Positive voltage supply | +12 volts. |
| Negative voltage supply | −12 volts. |

Resistor 11 and diode 15 in the circuit, according to invention, with the above components and values, were used to limit the amplitude of the input pulse to approximately 0.5 volt and prevent reverse bias burnout of the emitter-to-base junction of transistor 12. This circuit provided RF output pulses very closely maintaining the characteristics of the D.C. input pulses, such as pulse width and rise time, with rise times of less than 0.1 $\mu$s., being obtained.

It should be noted, that if the amplitude of D.C. pulses applied, as an input, were predictable and limited to a maximum (for example 1 volt), input coupling capacitor 10 could be eliminated along with resistor 11 and diode 15 since they would no longer be required for limiting the amplitude of input pulse voltage applied at the base of transistor 12. Obviously, with the elimination of the coupling capacitor 10, resistor 11, and diode 15 and with direct coupling of input signal voltage to the base of transistor 12 any time constant limitation is eliminated and it is possible to have substantially continuous RF signal output consistent with input pulse signals of various and substantially unlimited duration.

Whereas this invention is here illustrated and described with respect to the embodiment thereof, it should be realized that various changes may be made without departing from the essential contributions to the art made by the teaching hereof.

I claim:

A pulse controlled crystal RF oscillator system including: D.C. pulse input terminal means; a voltage ground source; RF output terminal means; RF signal generating means with a crystal; a first transistor including an emitter and a collector connected to two points of said RF signal generating means at opposite sides of the crystal; means for coupling D.C. input pulses to the base of said first transistor for bias control with D.C. pulses and no signal input for conduction and nonconduction between said emitter and said collector of said first transistor; a second transistor as amplifying means in said RF signal generating means; voltage biasing means; circuit means including feedback means and interconnecting the various components of said RF signal generating means including, said second transistor amplifying means, said voltage bias means, impedance means for developing bias, and including tuned subcircuit means; means coupling circuitry of the RF signal generating means to said RF output terminal means; and, wherein said crystal in said RF signal generating means is a piezoelectric crystal connected between the emitter and collector of said first transistor; said means for coupling D.C. input pulses from said D.C. pulse input terminal means to the base of the first transistor includes, serially, a capacitor and a first resistor; a second resistor connected between the base of said first transistor and said voltage ground source; a third resistor connected in parallel with a solid state diode between the base and the emitter of the first transistor; said voltage biasing means includes a positive voltage supply connected to the emitter of said first transistor, one side of the crystal, the third resistor, and said diode; a minus voltage supply connected through impedance means to the collector of the first transistor and the other side of the crystal; said tuned subcircuit means includes a tuned parallel capacitor and resistive subcircuit connected between one of said voltage supplies and said second transistor, and a tuned capacitive and inductive subcircuit connected between the other voltage supply and said second transistor; with the base of said second transistor having a common connection with said crystal and the collector of said first transistor; with said feedback means including the base connection of said second transistor with the collector of said first transistor and said crystal; and with said means coupling the RF oscillator to said RF output terminals being a transformer coupling from the tuned capacitor and inductive subcircuit.

References Cited by the Examiner

UNITED STATES PATENTS

| | | | |
|---|---|---|---|
| 2,476,997 | 7/1949 | Noyes | 331—173 |
| 2,905,907 | 9/1959 | Sanders | 331—173 |
| 2,957,943 | 10/1960 | Rack | 331—166 X |
| 3,058,013 | 10/1962 | Acker | 307—88.5 |

OTHER REFERENCES

Article by Stoner in CQ, February 1961, pages 70, 71, 106 and 110.

Benson: IBM Technical Disclosure Bulletin, "Pulse-Sharpening Device," vol. 2, No. 4, December 1959, pages 75, 76.

ROY LAKE, *Primary Examiner.*

JOHN KOMINSKI, *Examiner.*

J. B. MULLINS, *Assistant Examiner.*